United States Patent [19]

Wallace

[11] 4,362,575

[45] Dec. 7, 1982

[54] METHOD OF MAKING BURIED CHANNEL CHARGE COUPLED DEVICE WITH MEANS FOR CONTROLLING EXCESS CHARGE

[75] Inventor: Lloyd F. Wallace, Coatesville, Pa.

[73] Assignee: RCA Corporation, New York, N.Y.

[21] Appl. No.: 297,055

[22] Filed: Aug. 27, 1981

[51] Int. Cl.³ ............... H01L 27/10; H01L 21/263
[52] U.S. Cl. ........................ 148/1.5; 29/571; 148/187; 357/24; 357/91
[58] Field of Search ............. 148/1.5, 187; 29/571; 357/24 M, 24 LR, 91

[56] References Cited

U.S. PATENT DOCUMENTS

| | | | |
|---|---|---|---|
| 3,863,065 | 1/1975 | Kosonocky et al. | 250/211 |
| 3,896,474 | 7/1975 | Amelio et al. | 357/24 M |
| 3,927,468 | 12/1975 | Anthony et al. | 29/578 |
| 3,930,893 | 1/1976 | Tchon | 148/1.5 |
| 4,028,716 | 6/1977 | van Santen et al. | 357/24 |
| 4,076,557 | 2/1978 | Huang et al. | 148/1.5 |
| 4,108,686 | 8/1978 | Jacobus, Jr. | 148/1.5 |
| 4,152,715 | 5/1979 | Wang | 357/24 |
| 4,173,064 | 11/1979 | Farnow | 29/578 |
| 4,197,630 | 4/1980 | Kamprath | 29/571 |
| 4,212,683 | 7/1980 | Jones et al. | 148/1.5 |
| 4,280,855 | 7/1981 | Bertin et al. | 148/1.5 |

Primary Examiner—Upendra Roy
Attorney, Agent, or Firm—Birgit E. Morris; Donald S. Cohen; William J. Burke

[57] ABSTRACT

The preferred embodiment of a method of making a buried channel CCD starts with a body of P type semiconductor material over which an oxide layer and a photoresist are deposited. Openings are formed to expose regions of the body surface where drains are to be formed and N type impurity atoms are implanted through the openings. The openings are then enlarged to expose an additional area of the surface surrounding the drains and P type atoms are implanted through the enlarged openings to form channel stops. Afterward, the surface of the body is exposed and N type atoms are implanted to form buried channel regions on each side of the channel stops and to convert a thin layer of the channel stops to lightly doped compensation regions extending between the drains and the buried channel regions.

9 Claims, 5 Drawing Figures

METHOD OF MAKING BURIED CHANNEL CHARGE COUPLED DEVICE WITH MEANS FOR CONTROLLING EXCESS CHARGE

BACKGROUND OF THE INVENTION

This invention relates to a method of making charge coupled devices (hereinafter CCD's) of the type where excess charge is removed from the potential wells in a channel without spilling over to an adjacent well in that channel and, more particularly, to a method of making such devices with buried channels.

CCD's are electronic devices that store and transfer charge along a channel. They generally include a semiconductor substrate over which is formed an insulating layer as well as parallel electrodes that extend over the layer in a direction generally transverse to the channels. Between the channels, there are provided channel stop diffusions that form potential barriers to confine the charge in its channel by preventing it from spilling over to the adjacent channel. The electrodes are used to control potential wells in the substrate adjacent each electrode. By sequentially applying clocking signals, charge can accumulate in these wells and can be transferred from one well to the next along an individual channel.

One of the problems associated with CCD's is charge overload. For example, if the CCD is used in an image sensing array to store and transfer radiant energy and if an intense radiant energy source is imaged onto a particular well, the amount of charge generated at that location may be in excess of that which can be stored. This excess charge is prevented from leaving the channel because the surface potential created by the channel stop is lower than the surface potential between adjacent wells along a channel. Thus, the excess charge spills out of its potential well and into one or more adjacent wells in the same channel. This phenomena results in the spreading of any intense image read out of the array and is known as "blooming".

A solution to the charge overload or "blooming" problem is disclosed in U.S. Pat. No. 3,863,065 issued Jan. 28, 1975 to W. F. Kosonocky et al. This solution includes a drain in the form of diffusions in the center of each channel stop and a more lightly doped channel stop such that its potential barrier is less than that between wells along the channel. Excess charge spills over the lower potential barrier formed by the more lightly doped channel stops into the drain. The drain is connected to a voltage source and, thus, the excess charge is carried away.

When making buried channel CCD's in accordance with the Kosonocky et al. patent, a semiconductor wafer is first masked and then a first diffusion step is performed to form the drains. Thereafter, the masking material is stripped from the wafer and a second masking and diffusion step is performed to form the channel stops. At this point, the second mask is stripped from the wafer and a third masking and diffusion step is performed to form the channel regions. The numerous masking and diffusion steps add significantly to the cost of manufacture. Moreover, mask alignment problems between the drains and the channel stops are severe and even the slightest misalignment results in a distortion of the image. This also results in a significant loss of yield and adds to the cost of manufacture.

SUMMARY OF THE INVENTION

This invention provides a relatively economical method of making a buried channel CCD with means for controlling excess charge and also eliminates mask alignment problems. Starting with a body of semiconductor material of one conductivity type, an oxide layer and then a mask are provided over one surface of the body. Thereafter, openings are formed through the mask and the oxide layer where drains are to be formed and impurity atoms of the opposite conductivity type are implanted through the opening into the exposed surface of the body to form the drains. The opening is then enlarged to expose an additional area of the body surface around each drain and atoms of the one conductivity type are implanted through the enlarged openings into the exposed surface of the body. This forms channel stops extending around and below the previously formed drains. Afterward, the surface of the body is exposed and atoms of the opposite conductivity type are implanted into that exposed surface to form buried channel regions on each side of the channel stops and to convert a thin layer of these channel stops adjacent the surface to lightly doped compensation regions of the opposite conductivity type extending between the buried channel regions and the drains.

DETAILED DESCRIPTION OF A PREFERRED EMBODIMENT

Figure 1:
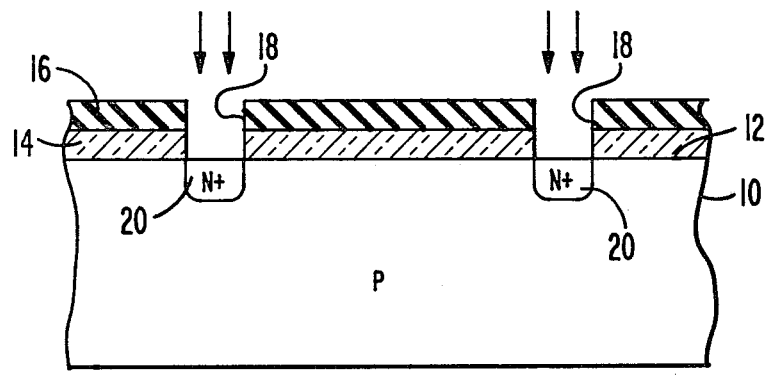
FIG. 1–4 are section views illustrating a method of making a CCD in accordance with this invention.
Figure 5:
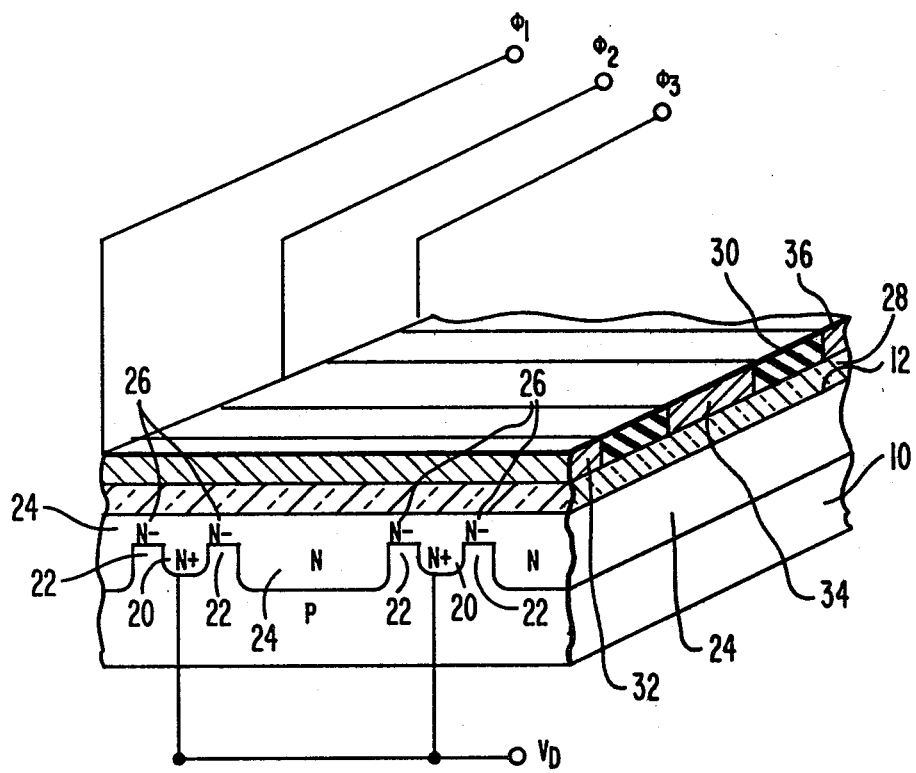
FIG. 5 is a broken away perspective view of a charge coupled device made in accordance with the method of this invention.

In FIG. 1 there is illustrated a body 10 of semiconductor material, for example silicon, on which is to be formed a buried channel CCD including buried N channel regions (shown generally at 24 in FIG. 5), channel stops (shown generally at 22 in FIG. 5) and excess charge drains (shown generally at 20 in FIG. 5). The device will be fully explained hereinafter. It should be understood that the CCD could be a P channel type device in which case all conductivity types described hereinafter would be reversed. Initially, the body 10 is a conventional silicon wafer uniformily doped with conductivity atoms of the P type. In the embodiment disclosed herein, the body 10 is doped with boron atoms in a concentration of about $10^{14}$ to $10^{15}$ atoms/cm$^3$. On one major surface 12 of the body 10 there is deposited an oxide layer 14 having a thickness within a range of about 4800 to 5400 Angstroms. The oxide layer extends uniformly over the surface 12 and can be silicon dioxide ($SiO_2$) thermally grown in an ambient of steam and hydrogen chloride (HCl) at a temperature of about 900° C. for about 5½ hours. After the oxide layer 14 is grown, its exposed surface is covered with a suitable masking layer 16. In carrying out a preferred embodiment of the invention, the layer 16 is a positive type photoresist applied with generally conventional techniques and processed in accordance with generally conventional photolithographic techniques to define protected and unprotected areas over the surface 12. The unprotected areas are located where the drains 20 of the device are to be formed. After photolithographic processing, openings 18 are etched in the areas of the oxide layer 14 adjacent the unprotected areas of the masking layer 16 to expose regions of the surface 12 where the drains 20 are to be formed. A conventional etchant such as a buffered hydrofluoric acid (HF) is used.

After the openings 18 are formed, ion implantation techniques are used to deposit a heavy concentration of N type atoms through the openings into the exposed regions of the surface 12. Arsenic (As) is the preferred dopant material because of its relatively slow diffusion rate, but it should be understood that phosphorous or other suitable N type dopant could be used. The arsenic implantation energy is 200 KeV and the dose is $3.6 \times 10^{14}$ atoms/cm$^2$. Typically, the arsenic atoms are implanted to a depth of about 100 Angstroms below the surface 12 and have a concentration of about $7 \times 10^{19}$ atoms/cm$^3$. After the arsenic atoms are implanted, the drains 20 are formed as illustrated in FIG. 1 of the drawing.

Figure 2:
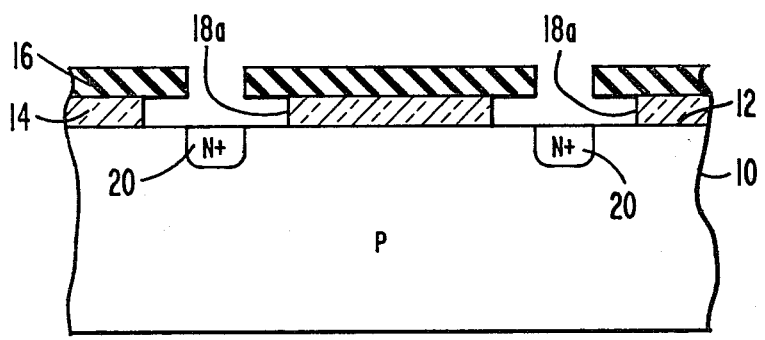
Figure 3:
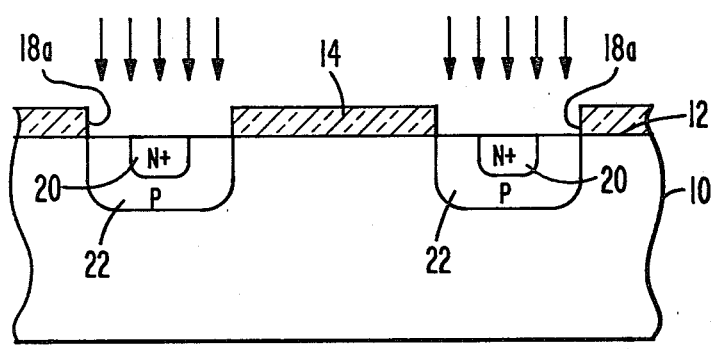

After the drains 20 are formed, the openings 18 in the oxide layer 14 are enlarged as shown at 18a in FIG. 2. Typically about 3 microns is added to each side of the opening 18. This is accomplished by etching back the oxide layer 14 around the opening 18. A suitable etchant such as buffered hydrofluoric acid is used for of about 20 minutes although it should be understood that the time depends on the size of the opening 18a. The hydrofluoric acid etches only the oxide layer 14, but does not etch the photoresist layer 16. It is believed that during the drain implant the arsenic or the phosphorous, if it is used, polymerizes or reacts with the photoresist to make it resistant to the etch. After the openings 18a are formed, the masking layer 16 is stripped from the oxide layer 14 and the body 10 is now ready for the formation of the channel stops 22 as illustrated in FIG. 3 of the drawing. Stripping of the photoresist 16 is done in a plasma etch for about 10 minutes. The plasma etch is necessary because the photoresist is otherwise difficult to remove after the implantation of the N type dopant. After the plasma etch, conventional cleaning techniques are used to remove any residue from the oxide layer 14.

Channel stops 22 are formed by depositing P type atoms into the surface 12 through the enlarged openings 18a by ion implantation techniques. Before implanting the channel stop, a very thin capping layer of oxide (not illustrated in the drawing) is formed over the surface regions exposed through the openings 18a. This is accomplished by exposing the body 10 to an ambient of steam and hydrogen chloride (HCl) at a temperature of about 900° C. for a period of about 10 minutes. The oxide layer thus formed has a thickness of about 300 to 350 Angstroms and it protects the surface regions from excessive damage during the actual ion implantation of the channel stops 22. It is particularly important to protect the surface regions adjacent the channel stops 22 from damage which could form recombination centers that would drain charge from the channels. The preferred P type dopant is boron and it is implanted with an energy of about 100 KeV in a dose of about $8 \times 10^{11}$ atoms/cm$^2$ to a depth of about 3000 Angstroms so that the channel stops extend below the drains 20 previously formed. The more deeply deposited boron atoms thus surround (as illustrated in FIG. 3) the previously deposited arsenic atoms, but do not convert the material in the region 20 to P type material. The channel stops 22 thus formed have a concentration of about $5 \times 10^{16}$ atoms/cm$^3$. Because of the slow diffusion rate of the arsenic used to form the drains 20, it can not diffuse down below the channel stops 22 during subsequent heating steps.

With the implantation of the arsenic atoms, the etch back and the implantation of the boron atoms, the drains 20 and channel stops 22 are self-aligned and a number of process steps have been eliminated. This greatly reduces the manufacturing cost of the device and picture distortion caused by mask misalignment is eliminated.

After the boron atoms have been implanted, the arsenic and the boron atoms are activated. That is, the body 10 is heated to a temperature of about 1000° C. in an inert ambient such as nitrogen (N$_2$) for a period of about 15 minutes. Such activation anneals the surface 12 of the body 10 repairing surface damage caused by the implantation and also drives the dopant atoms into proper location in the lattice network of the silicon body.

After the activation, the oxide layer 14 is stripped from the surface 12 and another thin capping oxide layer (also not shown in the drawing) is grown in its place in a manner similar to that previously explained. Now, the buried channel regions 24 are formed in the body 10. This too is accomplished by ion implantation techniques and in the preferred embodiment phosphorus atoms are implanted into the surface 12. The implant energy is preferably about 175 KeV with a dosage of about $1.3 \times 10^{12}$ atoms/cm$^2$. The phosphorus atoms are driven into a depth of about 2000 Angstroms and have a concentration of about $10^{17}$ atoms/cm$^3$. As the phosphorus atoms are implanted into the surface 12, they form lightly doped compensation regions 26 in the surface 12 adjacent the channel stops 22. That is, a thin layer of P type material forming the channel stops 22 is converted to a lightly doped N type material surrounding the sinks 20 and spacing the channel stops 22 from the surface 12. The compensation regions 26 extend to a depth of about 500 to 1000 Angstroms. These compensation regions 26 serve to partly control the potential barrier between the buried channel regions 24 and the drains 20 by controlling the location and configuration of the upper edge, i.e., the junction between the channel stops 22 and the compensation regions 26, relative to the surface 12. Ideally, this edge or junction should be relatively wide and parallel to the surface 12 so that a relatively wide, uniform potential barrier is provided. In this way, the effect of any recombination centers in the material between the potential barrier and the surface 12 will be minimized. The use of the ion implantation techniques disclosed in accordance with this invention provide this ideal edge.

Figure 4:
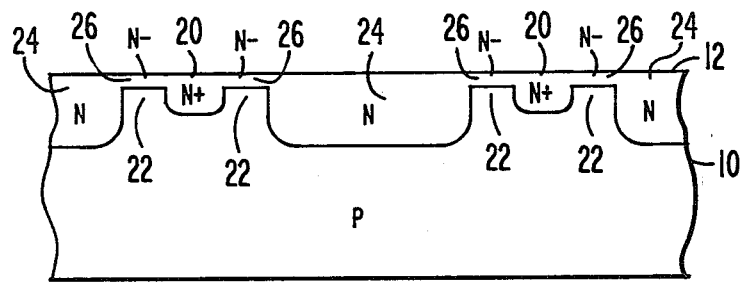

After the wafer has been processed as illustrated in FIG. 4 of the drawing, the capping oxide layer is removed and a channel oxide layer 28 is formed over the surface 12 as shown in FIG. 5. This channel oxide layer 28 is silicon dioxide thermally grown in hydrogen chloride and steam at a temperature of about 900° C. for a period of about $2\frac{1}{2}$ hours. This oxide growth also serves to activate the phosphorus atoms implanted to form the channels 24 and the compensation regions 26 so that no separate activation is needed. Afterwards, a polycrystalline silicon layer 30 is deposited over the channel oxide layer 28 in accordance with conventional techniques, e.g., by a chemical vapor deposition technique using silane (SiH$_4$) and an inert gas. Then, various portions of the polycrystalline silicon layer 30 are doped, e.g., by use of ion implantation techniques, with an N type material to form electrodes 32, 34 and 36 extending parallel to each other and transverse to the channels 24. The electrodes 32, 34 and 36 are connected to a voltage source to provide for three phase operation, but it should be understood that two or four phase operation can also be utilized with appropriate changes. The drains 20 are connected to a positive voltage source to drain any excess charge spilled over from the channels 24 to the drains during operation of the device.

In use, for example, in an imaging array, the operation of the device is generally conventional. That is, voltage is sequentially applied to the electrodes 32, 34 and 36 to control potential wells under the electrodes and under the channel regions 24. Radiant energy impinging on the device develops charge which accumulates in the wells and is transferred from one well to another as the electrodes 32, 34 and 36 vary the size of the potential wells. The potential barrier between the channel regions 24 and the drains 20 is controlled by the channel stops 22 and the compensation regions 24 and is slightly lower than the potential barrier between storage locations in a channel during accumulation. Thus, in the event that excess charge is accumulated, it spills over from the channel region 24 to the drains 20 where it is discharged to the potential connected thereto. Because of the precise manufacturing control over the impurity distribution and size of the compensation regions 26, the width of those regions, that is, the distance between the drain 20 and the channel region 24, can be made large enough so that the effect of surface defects or impurities in the compensation region is averaged out over a large area. Thus the effect of any recombination centers adjacent the channel stops 24 is minimized so that minimal charge is drained from the wells.

While in the foregoing there has been described a preferred embodiment of the invention, it should be obvious to those skilled in the art that various changes and modifications can be made without departing from the true spirit and scope of the invention as recited in the appended claims.

I claim:

1. A method of making a buried channel CCD on a body of semiconductor material of one conductivity type, said method comprising:
    forming an oxide layer over a surface of the body and applying a mask over the surface of said oxide layer;
    forming openings through said mask and said oxide layer to expose surface regions of the body where drains are to be formed and implanting ions of the opposite conductivity type through said openings into the exposed surface regions of said body to form drains extending into said body a predetermined distance from said surface;
    enlarging the size of said openings to expose an additional area of said surface around each of said drains and implanting ions of said one conductivity type through said enlarged openings into the exposed surface of said body to form channel stops extending into said body around and below said drains;
    exposing the surface of said body and implanting ions of said opposite conductivity type into said surface to form buried channel regions on each side of said channel stops and to convert a thin layer thereof adjacent said surface to lightly doped compensation regions of said opposite conductivity type.

2. A method in accordance with claim 1 wherein the ions implanted to form said drain and said channel stops are activated simultaneously.

3. A method in accordance with claim 1 wherein said openings are enlarged by exposing said body to an etchant that removes said oxide layer without removing said masking material.

4. A method in accordance with claim 1 wherein after said buried channel regions and said compensation regions are formed, a channel oxide layer is formed over said surface and electrodes are formed over said channel oxide layer.

5. A method in accordance with claim 4 wherein said channel oxide layer is thermally grown under conditions that simultaneously activates the impurity atoms in said buried channel regions and said compensation regions.

6. A method in accordance with claim 1 wherein said drains are formed by implanting arsenic (As) ions through said openings with the masking material in place and wherein said openings are enlarged by etching said oxide layer with hydrofluoric acid (HF).

7. A method in accordance with claim 1 wherein a thin oxide layer is formed on said exposed surface portions after enlarging the size of said openings and before forming said channel stops.

8. A method in accordance with claim 1 wherein said mask is stripped from said oxide layer by plasma etching after enlarging the size of said openings and before forming said channel stops.

9. A method of making a buried channel CCD on a body of semiconductor material of one conductivity type, said method comprising:
    forming an oxide layer over a surface of the body and applying a photoresist over the surface of said oxide layer;
    forming openings through said mask and said oxide layer to expose surface regions of the body where drains are to be formed and implanting ions of the opposite conductivity type through said openings into said body a predetermined distance from said surface;
    enlarging the size of said openings to expose an additional area of said surface around said drains by etching said oxide layer without removing said photoresist and then stripping said photoresist from said oxide layer by plasma etching;
    depositing a thin oxide layer over the exposed, enlarged surface region and then implanting ions of said one conductivity type through said enlarged openings into said body a distance greater than said predetermined distance to form channel stops extending into said body around and below said drains;
    simultaneously activating the atoms in said drain and said channel stops by heating said body in an inert ambient;
    stripping said oxide layer from said surface and forming another relatively thin oxide layer thereover, implanting ions of said opposite conductivity type into said surface a distance greater than said predetermined distance and less than said distance of channel stops to form buried channel regions on each side of channel stops and to convert a thin layer thereof adjacent said surface to lightly doped compensation regions of said opposite conductivity type, said thin layer extending into said body a distance less than said predetermined distance;
    thermally growing a channel oxide layer over said surface under conditions that simultaneously activate the atoms in said buried channel regions and said compensation regions and forming electrodes over said channel oxide layer.

* * * * *